(12) United States Patent
Wang et al.

(10) Patent No.: US 12,234,543 B2
(45) Date of Patent: Feb. 25, 2025

(54) METHOD FOR PREPARING BISMUTH OXIDE NANOWIRE FILMS BY HEATING IN UPSIDE DOWN POSITION

(71) Applicant: Institute of Analysis, Guangdong Academy of Sciences (China National Analytical Center, Guangzhou), Guangzhou (CN)

(72) Inventors: Fuxian Wang, Guangzhou (CN); Liling Wei, Guangzhou (CN); Qiong Liu, Guangzhou (CN); Hui Cheng, Guangzhou (CN)

(73) Assignee: Institute of Analysis. Guangdong Academy of Sciences (China National Analytical Center, Guangzhou), Guangzhou (CN)

( * ) Notice: Subject to any disclaimer, the term of this patent is extended or adjusted under 35 U.S.C. 154(b) by 895 days.

(21) Appl. No.: 17/423,470

(22) PCT Filed: Aug. 18, 2020

(86) PCT No.: PCT/CN2020/109676
§ 371 (c)(1),
(2) Date: Jul. 15, 2021

(87) PCT Pub. No.: WO2021/159680
PCT Pub. Date: Aug. 19, 2021

(65) Prior Publication Data
US 2022/0341027 A1      Oct. 27, 2022

(30) Foreign Application Priority Data

Aug. 17, 2020 (CN) .......................... 202010825523.5

(51) Int. Cl.
C23C 14/34 (2006.01)
C23C 14/02 (2006.01)
(Continued)

(52) U.S. Cl.
CPC ........ *C23C 14/3407* (2013.01); *C23C 14/021* (2013.01); *C23C 14/08* (2013.01);
(Continued)

(58) Field of Classification Search
None
See application file for complete search history.

(56) References Cited

U.S. PATENT DOCUMENTS

2005/0224360 A1* 10/2005 Varghese ............... C25D 11/26
205/171
2009/0058953 A1* 3/2009 Arakawa ............... C23C 14/088
347/68

(Continued)

FOREIGN PATENT DOCUMENTS

CN    102560360 A    7/2012
CN    103466701 A    12/2013
(Continued)

OTHER PUBLICATIONS

Jacques C. Vedrine, Heterogeneous Catalysis on Metal Oxides, Catalysts, 2017, pp. 1-25, 7, 341.

*Primary Examiner* — Jason Berman
(74) *Attorney, Agent, or Firm* — Bayramoglu Law Offices LLC

(57) ABSTRACT

A method for preparing bismuth oxide nanowire films by heating in an upside down position includes: washing a substrate, and fixing the substrate to a substrate support in a magnetron sputtering system in a position where an electrically conductive surface of the substrate faces downwards; placing a bismuth target, which is adhered to a copper backing plate, on a sputtering head in the magnetron sputtering system; performing direct current magnetron sputtering to form a bismuth film on the electrically conductive surface of the substrate; and regulating a heating temperature to maintain the bismuth film in a semi-molten state, and (Continued)

providing a predetermined oxygen gas concentration to form the bismuth oxide nanowire film.

10 Claims, 2 Drawing Sheets

(51) Int. Cl.
    *C23C 14/08*     (2006.01)
    *C23C 14/16*     (2006.01)
    *C23C 14/18*     (2006.01)
    *C23C 14/35*     (2006.01)
    *C23C 14/50*     (2006.01)
    *C23C 14/58*     (2006.01)
    *C25B 9/50*     (2021.01)
    *C25B 11/053*     (2021.01)
    *C25B 11/091*     (2021.01)

(52) U.S. Cl.
    CPC .......... *C23C 14/165* (2013.01); *C23C 14/185* (2013.01); *C23C 14/35* (2013.01); *C23C 14/505* (2013.01); *C23C 14/5853* (2013.01); *C25B 9/50* (2021.01); *C25B 11/053* (2021.01); *C25B 11/091* (2021.01)

(56) References Cited

U.S. PATENT DOCUMENTS

| | | | |
|---|---|---|---|
| 2012/0027955 A1* | 2/2012 | Sunkara | ................ C01G 23/07 977/762 |
| 2013/0136921 A1* | 5/2013 | Ding | ................ C23C 14/5806 428/428 |
| 2014/0158986 A1 | 6/2014 | Leung et al. | |
| 2019/0153585 A1* | 5/2019 | Lee | ................ C23C 14/5806 |

FOREIGN PATENT DOCUMENTS

| | | |
|---|---|---|
| CN | 103539956 A | 1/2014 |
| CN | 103614696 A | 3/2014 |
| CN | 109078633 A | 12/2018 |
| CN | 110218983 A | 9/2019 |
| CN | 110510655 A | 11/2019 |
| JP | 2011032159 A | 2/2011 |
| WO | 2020150020 A1 | 7/2020 |

* cited by examiner

METHOD FOR PREPARING BISMUTH OXIDE NANOWIRE FILMS BY HEATING IN UPSIDE DOWN POSITION

CROSS REFERENCE TO THE RELATED APPLICATIONS

This application is the national phase entry of International Application No. PCT/CN2020/109676, filed on Aug. 18, 2020, which is based upon and claims priority to Chinese Patent Application No. 202010825523.5, filed on Aug. 17, 2020, the entire contents of which are incorporated herein by reference.

TECHNICAL FIELD

The present invention relates to the technical field of catalysis, and particularly relates to a method for preparing bismuth oxide nanowire films by heating in an upside down position.

BACKGROUND

Catalysis plays a prominent role in modern industry. It is recognized that catalysis is involved in 85-90% of industrial chemical processes including the manufacturing of petro-, pharmaceutical- and fine-chemicals, clean fuels, etc., as well as pollution abatement technologies (Heterogeneous Catalysis on Metal Oxides. Catalysts 2017, 7(11), 341). Thus, catalyzed reactions have also attracted focus of scientists around the world, and thereby become one of the fastest-growing research fields. Using a catalyst leads to high activity, which largely increases the efficiency of an industrial production process. The activity of a catalyst can be affected by many factors, and one important factor among others is the surface nanostructure of the catalyst material. A catalyst material with suitable surface nanostructure presents a higher specific surface area, which allows intensive interaction at the phase interface, and provides more active sites for reaction. Nanostructures can be produced through special treatment along with spin coating, photodeposition, electrodeposition, or chemical vapor deposition. However, these methods are featured by their pollutive effects and complicated manufacturing processes, which limit large-scale industrial production. Direct current (DC) magnetron sputtering is a low-cost and non-pollutive method suitable for large-scale industrial production; however, films produced by DC magnetron sputtering are usually compact and homogeneous that it is difficult to form surface nanostructures.

SUMMARY

One object of the present invention is to provide a method for preparing bismuth oxide nanowire films by heating in an upside down position. The method, by innovatively taking advantage of the low melting point of bismuth, involves the deposition of bismuth by DC magnetron sputtering onto a conductive surface of the substrate in an upside down position, including precisely regulating the heating temperature to maintain the bismuth in a semi-molten state and providing a suitable oxygen gas concentration, such that a bismuth oxide film with specific nanowire structure is produced from the semi-molten bismuth under the combined action of gravity and surface tension, which thereby solve the prior art problem that it is difficult to form surface nanostructures by DC magnetron sputtering as the films produced are compact and homogeneous. Further innovatively, the bismuth target is adhered to a copper backing plate for enhanced thermal conduction, and a forced water cooling technique is introduced for cooling the target, which successfully solve the technical problem that the bismuth target with a low melting point may easily melt and deform during the magnetron sputtering process. The bismuth oxide nanowire films produced by the present invention can not only be applied directly in catalyzed reactions, but also serve as carriers that provide other catalysts with nanostructure substrate of high specific surface area, which largely increases the specific surface area and active sites in catalyzed reactions and thereby improves the catalysis effect.

The present invention realized the above object by the below technical solutions.

A method for preparing a bismuth oxide ($Bi_2O_3$) nanowire film by heating in an upside down position is provided, which comprises: washing a substrate, and fixing the substrate to a substrate support in a magnetron sputtering system in such a position that an electrically conductive surface of the substrate faces downwards; placing a bismuth target, which is adhered to a copper backing plate, on a sputtering head in the magnetron sputtering system; performing direct current magnetron sputtering to form a bismuth film on the electrically conductive surface of the substrate; regulating a heating temperature to maintain the bismuth film in a semi-molten state, and providing a suitable oxygen gas concentration to form the bismuth oxide nanowire film with specific nanowire structure from the semi-molten bismuth under the combined action of gravity and surface tension.

Specifically, the method comprises:
(1) washing the substrate, and fixing the substrate to a substrate support in a sputtering chamber of the magnetron sputtering system in such a position that the electrically conductive surface of the substrate faces downwards; placing the bismuth target, which is adhered to the copper backing plate, on the sputtering head in the magnetron sputtering system, wherein the sputtering head is provided with a forced water cooling system, and the forced water cooling system is configured to maintain a temperature of the sputtering head at 10° C.-20° C.; closing a cover of the sputtering chamber;
(2) vacuumizing the sputtering chamber, starting a rotation stage to rotate, heating the substrate to 25° C.-274° C., and starting the forced water cooling system to maintain the temperature of the sputtering head at 10° C.-20° C., wherein a flow speed of circulating water in the forced water cooling system is 1-5 m/s; once the sputtering chamber is vacuumized to a level below $6\times10^{-4}$ Pa, introducing argon gas into the sputtering chamber at a flow rate of 20-30 mL/min, and then maintaining a pressure in the sputtering chamber at 0.6-2.0 Pa; starting a power supply of the sputtering head at a power of 10-100 W to allow deposition of the bismuth film on the substrate for a period of 1 minute to 2 hours, wherein a thickness of the bismuth film is regulated by adjusting a length of the period; and
(3) continuously introducing the argon gas, and regulating the heating temperature to 274° C.-350° C. to maintain the bismuth film in the semi-molten state; once a substrate temperature is stable, introducing a mixture of argon gas and oxygen gas for 5 minutes to 2 hours to form the bismuth oxide nanowire film.

In step (1), the bismuth target is made of bismuth, and is adhered to the copper backing plate for enhanced thermal conduction.

In step (1), the step of washing the substrate comprises subjecting the substrate to ultrasonic treatment in propanone, then subjecting the substrate to ultrasonic treatment in ethanol, and blow drying the substrate with nitrogen gas.

In step (3), the oxygen gas is introduced at a flow rate of 1-10 mL/min, and the argon gas is introduced at a flow rate of 20-30 mL/min.

The rotation stage rotates at 5-30 r/min.

The substrate is made of fluorine-doped tin oxide (FTO), indium tin oxide (ITO), Si, Si/SiO$_2$, glass, quartz, platinum, stainless steel, nickel, or copper.

The present invention also provides the use of the bismuth oxide nanowire film. The film can be directly used as a catalyst or as a carrier for other catalysts such as CuBi$_2$O$_4$ to form a photoelectrocatalytic electrode that largely increases the photocurrent density.

The present invention has the following beneficial effects:
1) The present invention, by innovatively taking advantage of the low melting point of bismuth, involves the deposition of bismuth by DC magnetron sputtering onto a conductive surface of the substrate in an upside down position, including precisely regulating the heating temperature to maintain the bismuth in a semi-molten state and providing a suitable oxygen gas concentration, such that a bismuth oxide film with specific nanowire structure is produced from the semi-molten bismuth under the combined action of gravity and surface tension, which thereby solve the prior art problem that it is difficult to form surface nanostructures by DC magnetron sputtering as the films produced are compact and homogeneous. Further innovatively, the bismuth target is adhered to a copper backing plate for enhanced thermal conduction, and a forced water cooling technique is introduced for cooling the target, which successfully solve the technical problem that the bismuth target with a low melting point may easily melt and deform during the magnetron sputtering process.
2) The present invention is featured by its simple manufacturing method, low cost, and non-pollutive performance, which allow large-scale industrial production. The bismuth oxide nanowire films produced by the present invention, which present specific nanostructures, can not only be used directly as catalysts, but also serve as carriers for other catalysts which largely increase the specific surface area and active sites in catalyzed reactions and thereby improves the catalysis effect. Therefore, the films have broad application prospects in the field of catalyzed reactions, especially in the field of photoelectrocatalytic reactions.

DETAILED DESCRIPTION OF THE EMBODIMENTS

The following description is to further describe the present invention, rather than limiting the scope of present invention.

Example 1: A Method for Preparing a Bismuth Oxide Nanowire Film

Figure 1:
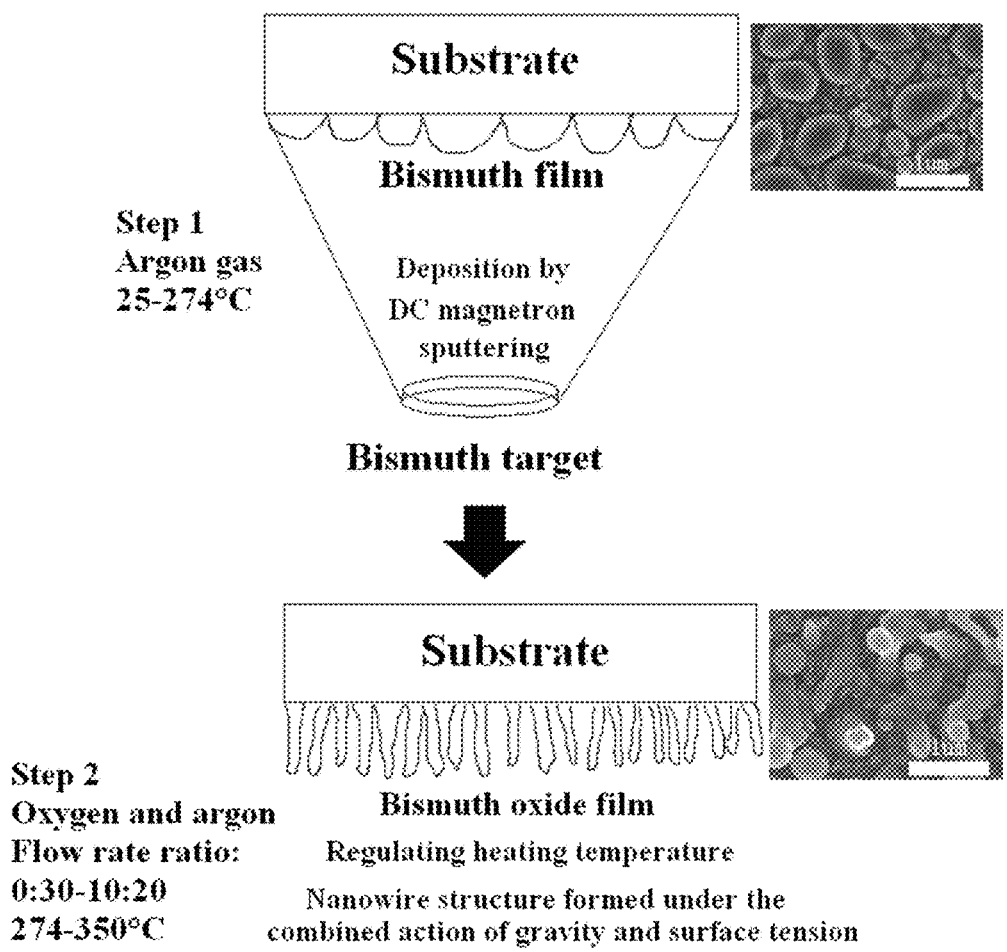
FIG. 1 shows the steps for preparing a bismuth oxide nanowire film.

As shown in FIG. 1, the method comprises the following steps:
(1) A substrate was firstly subjected to ultrasonic treatment in propanone for 10 minutes and in ethanol for 10 minutes, and then blow-dried with nitrogen gas. The washed substrate was fixed to a substrate support in a sputtering chamber of the magnetron sputtering system in such a position that the electrically conductive surface of the substrate faced downwards. A high-purity bismuth target adhered to a copper backing plate was placed on the sputtering head in the magnetron sputtering system wherein the sputtering head was provided with a forced water cooling system. Then, the cover of the sputtering chamber was closed.
(2) The sputtering chamber was vacuumized, and the rotation stage was started up to rotate at 5-15 r/min. The substrate was then heated to 25° C.-150° C., and the forced water cooling system was started up to maintain the temperature of the sputtering head at 10° C.-15° C., wherein a flow speed of circulating water in the forced water cooling system was 1-2 m/s. Once the sputtering chamber was vacuumized to a level below 6×10$^{-4}$ Pa, argon gas was introduced into the sputtering chamber at a flow rate of 20-25 mL/min, and then the pressure in the sputtering chamber was maintained at 0.6-1.0 Pa.
(3) The power supply of the sputtering head was started up at a power of 10-60 W. Once a stable glow was observed, the baffle of the substrate support was moved away to allow deposition of a bismuth film on the substrate for a period of 1 minute to 1 hour, wherein a thickness of the bismuth film was regulated by adjusting the a length of the period;
(4) As the argon gas was introduced continuously, the heating temperature was precisely regulated to 274° C.-300° C. to maintain the bismuth film in a semi-molten state. Once the substrate temperature was stable, a mixture of argon gas and oxygen gas was introduced to allow oxidation over the film for 5-60 minutes to form the nanowire structure, wherein the oxygen gas was introduced at a flow rate of 5-10 mL/min, and the argon gas was introduced at a flow rate of 20-25 mL/min.

Figure 2:
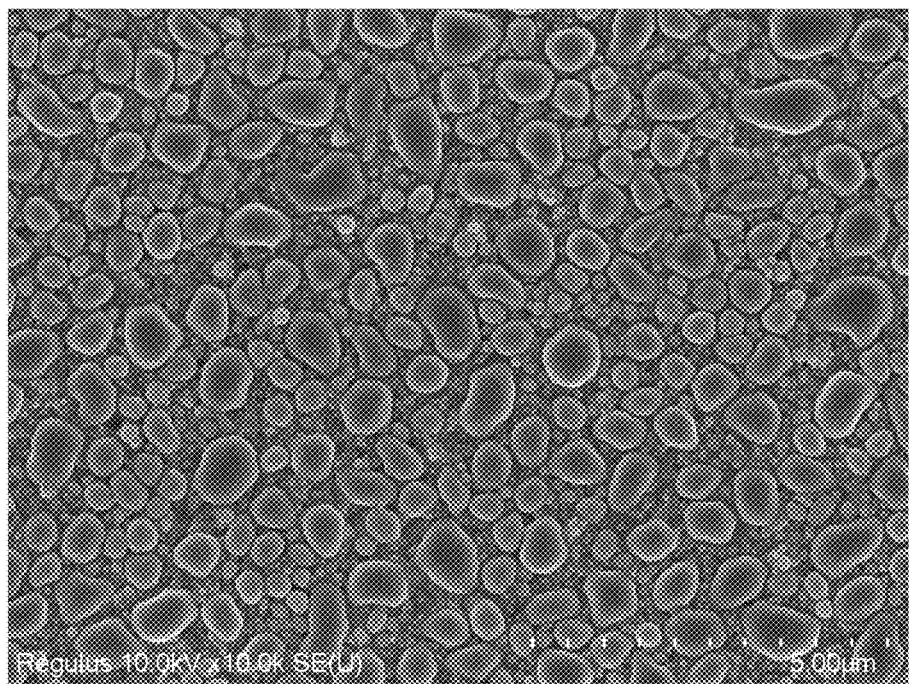
FIG. 2 is a scanning electron microscope (SEM) image of the bismuth film produced in Example 1.
Figure 3:
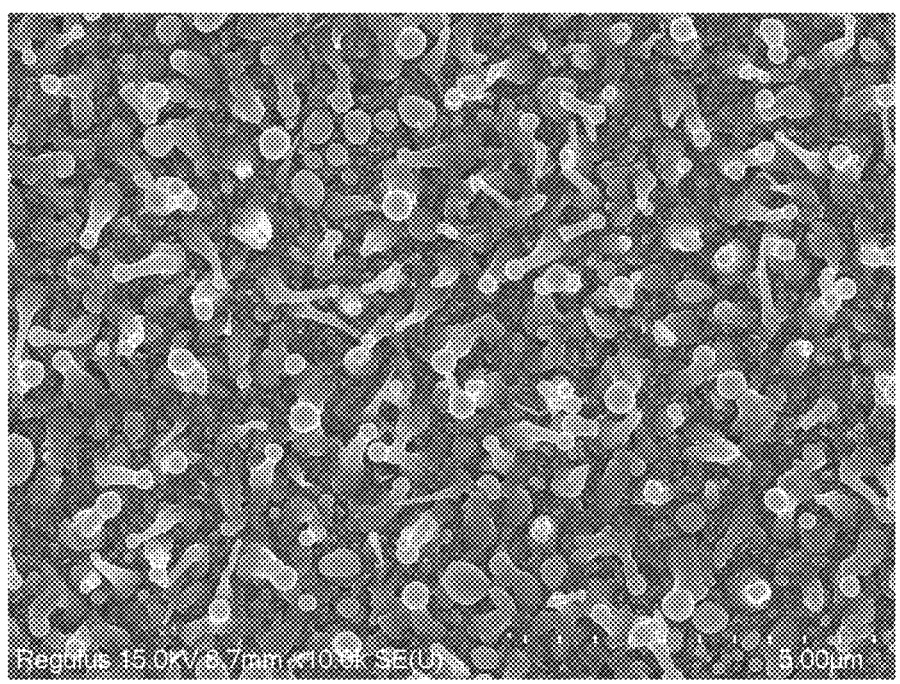
FIG. 3 is a scanning electron microscope (SEM) image of the bismuth oxide nanowire film produced in Example 1.

FIG. 2 and FIG. 3 are respectively scanning electron microscope (SEM) images showing the morphology of bismuth film before heating and the morphology of bismuth oxide nanowire film after heating. The images clearly show the drop-like structure of bismuth before heating and the bismuth oxide nanowire structures formed on the substrate after heating.

Example 2

The method was performed identical to Example 1 except that the rotation stage rotated at 15-30 r/min.

Example 3

The method was performed identical to Example 1 except that the temperature of the sputtering head was maintained at 15° C.-20° C., and a flow speed of circulating water in the forced water cooling system was 2-5 m/s.

Example 4

The method was performed identical to Example 1 except that the oxygen gas was introduced at a flow rate of 1-5 mL/min, and the argon gas was introduced at a flow rate of 25-30 mL/min.

Example 5

The method was performed identical to Example 1 except that the pressure in the sputtering chamber was maintained at 1.0-2.0 Pa.

Example 6

The method was performed identical to Example 1 except that the power on the target was 60-100 W.

Example 7

The method was performed identical to Example 1 except that the substrate was heated to 150° C.-274° C., and the deposition of the bismuth film on the substrate was carried out for a period of 1 hour to 2 hours.

Example 8

The method was performed identical to Example 1 except that the heating temperature was regulated to 300° C.-350° C., and the oxidation over the film was carried out for 60 minutes to 2 hours to form the nanowire structure.

Application Example 1

A layer of $CuBi_2O_4$ was loaded on the bismuth oxide nanowire film obtained in Example 1 to give a bismuth oxide nanowire/$CuBi_2O_4$ electrode. A chopped-illumination test was carried out on the bismuth oxide nanowire/$CuBi_2O_4$ electrode, a $CuBi_2O_4$ electrode, and a bismuth oxide nanowire electrode:

Photoelectrochemistry measurements were performed in a three-electrode configuration, with a solution comprising 0.3 mol/L of potassium sulfate and 0.2 mol/L of phosphate as electrolyte, under chopped illumination from an AM 1.5G (100 mW/cm$^2$) xenon lamp. The bismuth oxide nanowire/$CuBi_2O_4$ electrode, the $CuBi_2O_4$ electrode, and the bismuth oxide nanowire electrode served as the working electrodes. Ag/AgCl and Platinum were employed as the reference and counter electrodes, respectively.

Figure 4:
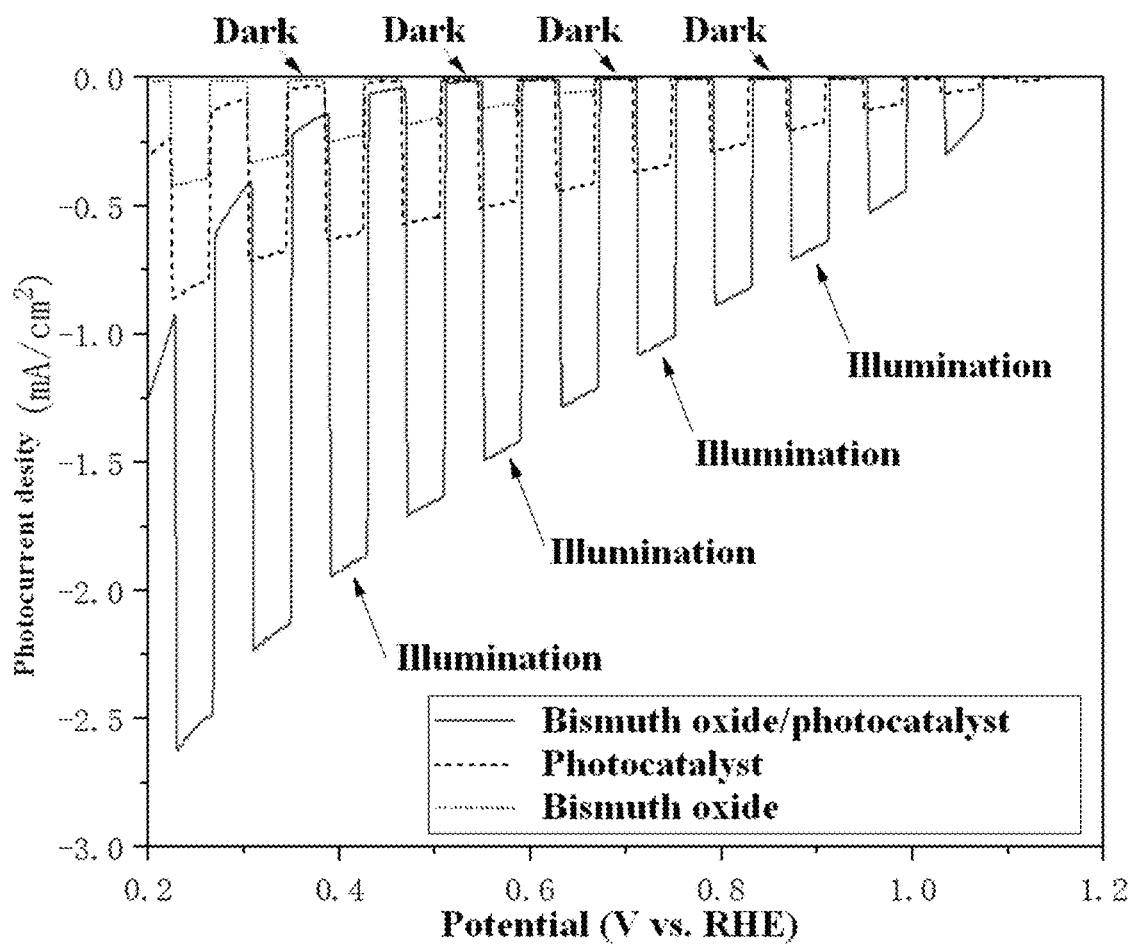
FIG. 4 shows the chopped photocurrent-potential curves of the electrodes consisting of bismuth oxide nanowires/CuBi$_2$O$_4$ catalyst in Application Example 1.

FIG. 4 shows the chopped photocurrent-potential curves of the bismuth oxide nanowire/$CuBi_2O_4$ electrode, the $CuBi_2O_4$ electrode, and the bismuth oxide nanowire electrode. It can be seen from the curves that the bismuth oxide nanowire/$CuBi_2O_4$ electrode exhibited excellent photoresponse, with a large increase in photocurrent density as compared with the $CuBi_2O_4$ electrode and the bismuth oxide nanowire electrode. It can also be seen from the curves that the bismuth oxide nanowire film obtained in Example 1 exhibited photoresponse under illumination, indicating that the bismuth oxide nanowire film can be directly used as a catalyst. It should be noted that, the bismuth oxide nanowire/$CuBi_2O_4$ electrode exhibited a large increase in dark current density as compared with the $CuBi_2O_4$ electrode and the bismuth oxide nanowire electrode, indicating that the bismuth oxide nanowire films produced by the present invention have very high application value in electrocatalysis.

What is claimed is:
1. A method for preparing a bismuth oxide nanowire film by heating in an upside down position, wherein a chemical formula of bismuth oxide is $Bi_2O_3$, and the method comprises:
    washing a substrate, and fixing the substrate to a substrate support in a magnetron sputtering system in a position, wherein an electrically conductive surface of the substrate faces downwards in the position;
    placing a bismuth target on a sputtering head in the magnetron sputtering system, wherein the bismuth target is adhered to a copper backing plate;
    performing direct current magnetron sputtering to form a bismuth film on the electrically conductive surface of the substrate; and
    regulating a heating temperature to maintain the bismuth film in a semi-molten state, and providing a predetermined oxygen gas concentration to form the bismuth oxide nanowire film.
2. The method according to claim 1, comprising:
    (1) washing the substrate, and fixing the substrate to the substrate support in a sputtering chamber of the magnetron sputtering system in the position; placing the bismuth target on the sputtering head in the magnetron sputtering system, wherein the sputtering head is provided with a forced water cooling system, and the forced water cooling system is configured to maintain a temperature of the sputtering head at 10° C.-20° C.; closing a cover of the sputtering chamber;
    (2) vacuumizing the sputtering chamber, starting a rotation stage to rotate, heating the substrate to 25° C.-274° C., and starting the forced water cooling system to maintain the temperature of the sputtering head at 10° C.-20° C., wherein a flow speed of circulating water in the forced water cooling system is 1-5 m/s; once the sputtering chamber is vacuumized to a level below $6 \times 10^{-4}$ Pa, introducing an argon gas into the sputtering chamber at a flow rate of 20-30 mL/min, and then maintaining a pressure in the sputtering chamber at 0.6-2.0 Pa; starting a power supply of the sputtering head at a power of 10-100 W to allow deposition of the bismuth film on the substrate for a period of 1 minute to 2 hours, wherein a thickness of the bismuth film is regulated by adjusting a length of the period; and
    (3) continuously introducing the argon gas, and regulating the heating temperature to 274° C.-350° C. to maintain the bismuth film in the semi-molten state; once a substrate temperature is stable, introducing a mixture of the argon gas and an oxygen gas for 5 minutes to 2 hours to form the bismuth oxide nanowire film.
3. The method according to claim 1, wherein the bismuth target is made of bismuth.
4. The method according to claim 1, wherein the step of washing the substrate comprises:
    subjecting the substrate to a first ultrasonic treatment in propanone,
    then subjecting the substrate to a second ultrasonic treatment in ethanol, and
    blow drying the substrate with nitrogen gas.
5. The method according to claim 1, wherein the substrate is made of fluorine-doped tin oxide (FTO), indium tin oxide (ITO), Si, $Si/SiO_2$, glass, quartz, platinum, stainless steel, nickel, or copper.

6. The method according to claim 2, wherein, in step (3), the oxygen gas is introduced at a flow rate of 1-10 mL/min, and the argon gas is introduced at a flow rate of 20-30 mL/min.

7. The method according to claim 2, wherein the rotation stage rotates at 5-30 r/min.

8. The method according to claim 2, wherein the bismuth target is made of bismuth.

9. The method according to claim 2, wherein the step of washing the substrate comprises:
   subjecting the substrate to a first ultrasonic treatment in propanone,
   then subjecting the substrate to a second ultrasonic treatment in ethanol, and
   blow drying the substrate with nitrogen gas.

10. The method according to claim 2, wherein the substrate is made of fluorine-doped tin oxide (FTO), indium tin oxide (ITO), Si, Si/SiO$_2$, glass, quartz, platinum, stainless steel, nickel, or copper.

* * * * *